(12) United States Patent
Chi et al.

(10) Patent No.: US 8,587,129 B2
(45) Date of Patent: Nov. 19, 2013

(54) INTEGRATED CIRCUIT PACKAGING SYSTEM WITH THROUGH SILICON VIA BASE AND METHOD OF MANUFACTURE THEREOF

(75) Inventors: HeeJo Chi, Ichon si (KR); NamJu Cho, Uiwang-si (KR); YeongIm Park, Suwon (KR)

(73) Assignee: STATS ChipPAC Ltd., Singapore (SG)

( * ) Notice: Subject to any disclaimer, the term of this patent is extended or adjusted under 35 U.S.C. 154(b) by 298 days.

(21) Appl. No.: 12/534,029

(22) Filed: Jul. 31, 2009

(65) Prior Publication Data

US 2011/0024887 A1  Feb. 3, 2011

(51) Int. Cl.
  *H01L 23/48* (2006.01)
  *H01L 23/52* (2006.01)
  *H01L 29/40* (2006.01)

(52) U.S. Cl.
  USPC .......................................... 257/776; 438/637

(58) Field of Classification Search
  USPC .................. 438/637; 257/774–777
  See application file for complete search history.

(56) References Cited

U.S. PATENT DOCUMENTS

| | | | |
|---|---|---|---|
| 6,873,054 B2 | 3/2005 | Miyazawa et al. | |
| 6,908,856 B2 | 6/2005 | Beyne et al. | |
| 6,998,344 B2 | 2/2006 | Akram et al. | |
| 7,122,906 B2 * | 10/2006 | Doan | 257/778 |
| 7,276,799 B2 * | 10/2007 | Lee et al. | 257/777 |
| 7,282,431 B2 | 10/2007 | Kang et al. | |
| 7,354,798 B2 | 4/2008 | Pogge et al. | |
| 7,553,752 B2 | 6/2009 | Kuan et al. | |
| 2007/0284729 A1 | 12/2007 | Kwon et al. | |
| 2008/0237880 A1 | 10/2008 | Lin et al. | |
| 2008/0272465 A1 * | 11/2008 | Do et al. | 257/620 |
| 2008/0272477 A1 | 11/2008 | Do et al. | |
| 2008/0302560 A1 * | 12/2008 | Tanno et al. | 174/255 |
| 2009/0212397 A1 * | 8/2009 | Tuttle | 257/618 |

* cited by examiner

*Primary Examiner* — Jenny L Wagner
(74) *Attorney, Agent, or Firm* — Ishimaru & Associates LLP

(57) ABSTRACT

A method of manufacture of an integrated circuit packaging system includes: providing a base having a through-conductor and having an insulator protecting the base and the through-conductor; mounting a chip over the base and connected to the base with a first interconnect; forming a second interconnect above the base and horizontally beside the chip; and encapsulating the chip, the first interconnect, and the second interconnect with an encapsulation.

20 Claims, 11 Drawing Sheets

INTEGRATED CIRCUIT PACKAGING SYSTEM WITH THROUGH SILICON VIA BASE AND METHOD OF MANUFACTURE THEREOF

TECHNICAL FIELD

The present invention relates generally to an integrated circuit packaging system and more particularly to a system for utilizing a through silicon via base in an integrated circuit packaging system.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base having a through-conductor and having an insulator protecting the base and the through-conductor; mounting a chip over the base and connected to the base with a first interconnect; formed a second interconnect above the base and horizontally beside the chip; and encapsulating the chip, the first interconnect, and the second interconnect with an encapsulation.

The present invention provides an integrated circuit packaging system including: a base that has a through-conductor and has an insulator protecting the base and the through-conductor; a chip mounted over the base; a first interconnect that connects the chip to the base; a second interconnect formed above the base and horizontally beside the chip; and an encapsulation that encapsulates the first interconnect and the second interconnect.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
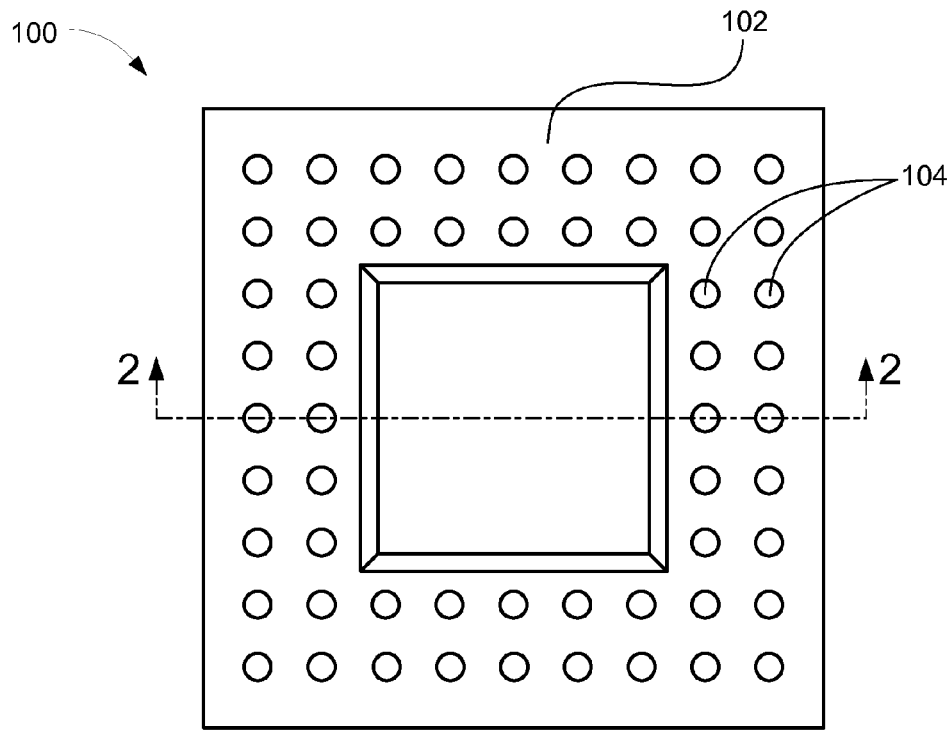
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an encapsulation 102 such as a film assisted molding, which protects sensitive components from moisture, dust and other contamination. The encapsulation 102 surrounds interconnects 104 such as solder balls that are exposed from the encapsulation 102 for future connection to external components.

Figure 2:
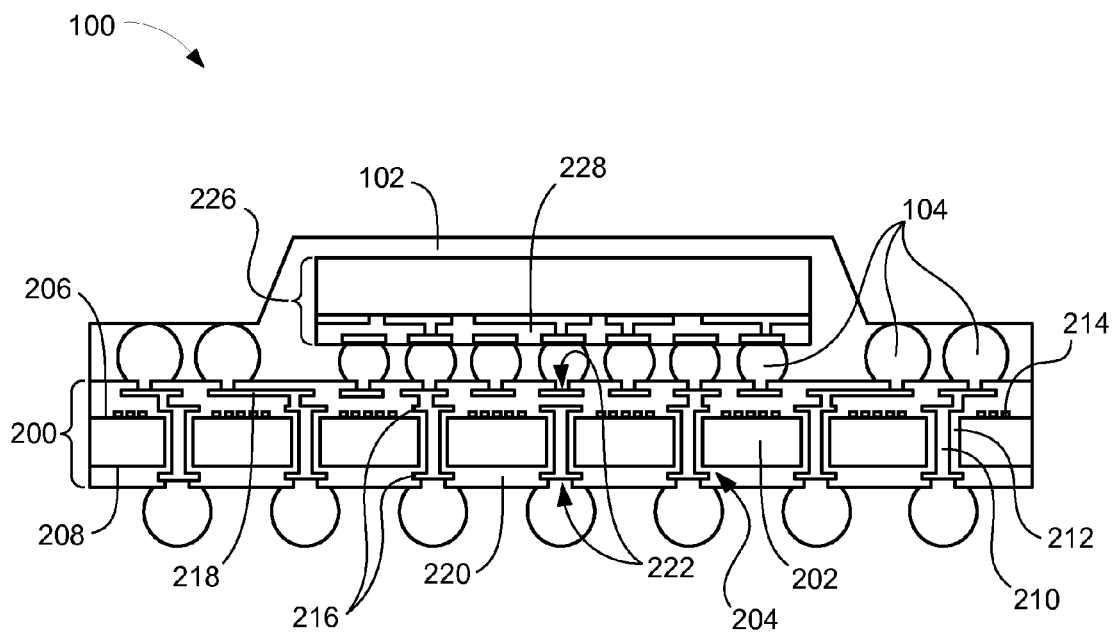
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1.

The integrated circuit packaging system 100 is shown having a base such as a through-silicon-via base (TSV base 200). The TSV base 200 is shown having a substrate 202 such as a through-silicon-via substrate having vias 204 etched through the substrate 202 from a top side 206 through a bottom side 208. The substrate 202 has through-conductors 210 such as metal through-conductors inside the vias 204. The through-conductor 210 is defined as a conductive element that spans the height of the vias 204 from the top side 206 of the substrate 202 to the bottom side 208 of the substrate 202.

Between the substrate 202 and the through-conductors 210 is an insulator 212 such as silicone dioxide. The top side 206 of the substrate 202 may be bare silicone or may be functional containing active or passive components such as transistors 214 such as CMOS transistors. The insulator 212 is within one of the vias 204 and directly on the through-conductor 210 and the substrate 202.

The through-conductors 210 have contact pads 216 on both ends of the through-conductors 210. The contact pads 216 formed on the through-conductors 210 can be above and below the transistors 214. Above the transistors 214 and connected to the contact pads 216 is a redistribution line (RDL 218). A redistribution line is defined as any conductive pathway which routs signals between two points and is formed by repeated process steps of masking, depositing metal, and depositing insulation. The RDL 218 routs signals from the through-conductors 210 to other components and other connective nodes above the top side 206 of the substrate 202. The insulator 220 is formed directly on and conformed to the RDL 218 and the top side 206 and the bottom side 208 of the substrate 202.

Surrounding the contact pads 216, the RDL 218, the transistors 214, and the top side 206 and the bottom side 208 of the substrate 202 is an insulator 220 such as silicon dioxide. The insulator 220 has holes 222 etched out to expose portions of the contact pads 216 of the through-conductors 210 and portions of the RDL 218.

The interconnects 104 such as solder bumps are deposited underneath the TSV base 200 and in the holes 222 of the insulator 220. A chip such as an integrated circuit 226 such as a flip-chip is connected to the RDL 218 with the interconnects 104. The integrated circuit 226 has an active side 228 facing the substrate 202.

The interconnects 104 are also deposited above the TSV base 200 in the holes 222 of the insulator 220 and bordering the integrated circuit 226. The interconnects 104 bordering the integrated circuit 226 and the integrated circuit 226 are encapsulated in the encapsulation 102.

The interconnects 104 bordering the integrated circuit 226 are exposed from the encapsulation 102. It has been discovered that the use of the TSV base 200 having the transistors 214 formed on the substrate 202 greatly reduces the height of the overall package because two active surfaces (the active surface on the substrate 202 and the active side 228 on the integrated circuit 226) can effectively be put in a single package using only one substrate 202.

It has further been discovered that the use of the TSV base 200 greatly reduces the amount of flex and warpage of the integrated circuit packaging system 100 due to the superior physical characteristics of the substrate 202 when compared to the laminated plastic or UV stabilized woven glass and epoxy resin currently being used.

It has still further been discovered that the use of the TSV base 200 increases the density and functionality of the integrated circuit packaging system 100 while reducing process steps. This increases factory throughput, decreases line yield and reduces production costs.

Figure 3A:
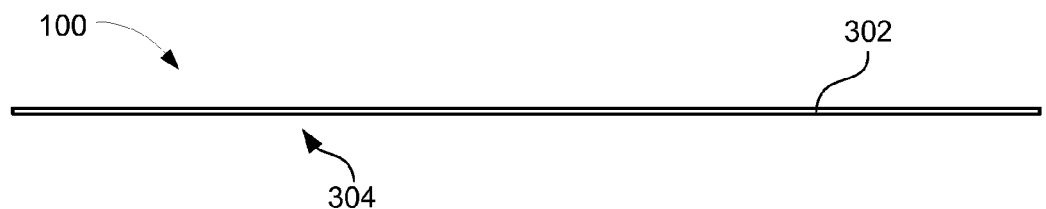
FIG. 3A is an integrated circuit packaging system of FIG. 2 in a wafer providing phase of manufacture.

Referring now to FIG. 3A. therein is shown an integrated circuit packaging system 100 of FIG. 2 in a wafer providing phase of manufacture. The integrated circuit packaging system 100 is shown having the substrate 202 of FIG. 2 provided as part of a wafer 302.

FIGS. 3B-3M depict a highly simplified process overview for forming PMOS MOSFET for CMOS transistor logic on the wafer 302. It must be noted that many components may be formed on the wafer 302 such as memory, logic, analog devices, or none of these depending on the application of the integrated circuit packaging system 100.

Figure 3B:
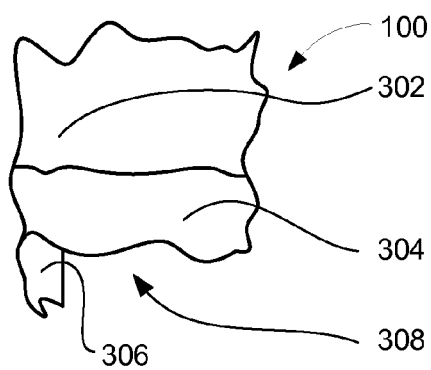
FIG. 3B is a magnified region of the integrated circuit packaging system of FIG. 3A.

Referring now to FIG. 3B, therein is shown a magnified region 304 of the integrated circuit packaging system 100 of FIG. 3A. The integrated circuit packaging system 100 is shown having the wafer 302 such as a silicon wafer having a deep subcollector implant barrier 304 deposited thereon and having a film of exposed photoresist 306 deposited on the deep subcollector implant barrier 304.

The photoresist 306 is shown having vias 308, which will expose portions of the deep subcollector implant barrier 304 to an etch process.

Figure 3C:
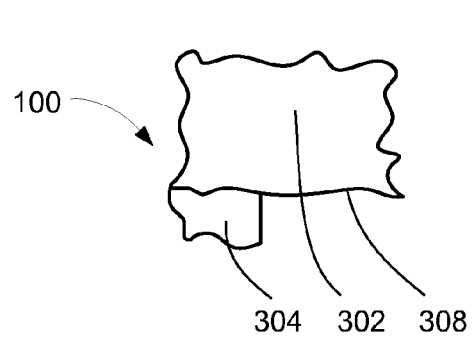
FIG. 3C is an integrated circuit packaging system of FIG. 3B after a deep subcollector implant barrier etch phase of manufacture.

Referring now to FIG. 3C, therein is shown an integrated circuit packaging system 100 of FIG. 3B after a deep subcollector implant barrier etch phase of manufacture. The integrated circuit packaging system 100 is shown having the deep subcollector implant barrier 304 etched exposing a portion 308 of the wafer 302.

Figure 3D:
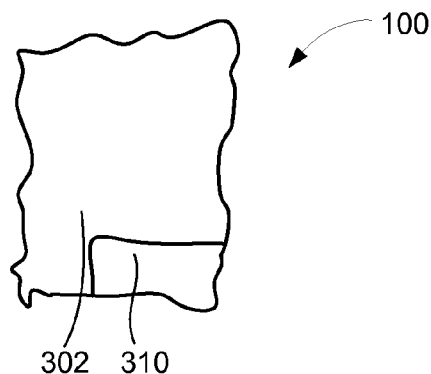
FIG. 3D is the integrated circuit packaging system of FIG. 3B after a deep subcollector implant phase of manufacture.

Referring now to FIG. 3D, therein is shown the integrated circuit packaging system 100 of FIG. 3B after a deep subcollector implant phase of manufacture. The wafer 302 is shown having a deep subcollector well 310 implanted in the wafer 302 and the deep subcollector implant barrier 304 of FIG. 3C has been removed.

Figure 3E:
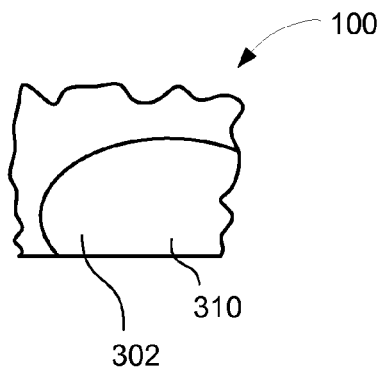
FIG. 3E is the integrated circuit packaging system of FIG. 3B after a high temperature anneal phase of manufacture.

Referring now to FIG. 3E, therein is shown the integrated circuit packaging system 100 of FIG. 3B after a high temperature anneal phase of manufacture. The integrated circuit packaging system 100 is shown having the deep subcollector well 310 dispersed deeper into the wafer 302 through the high temperature annealing process.

Figure 3F:
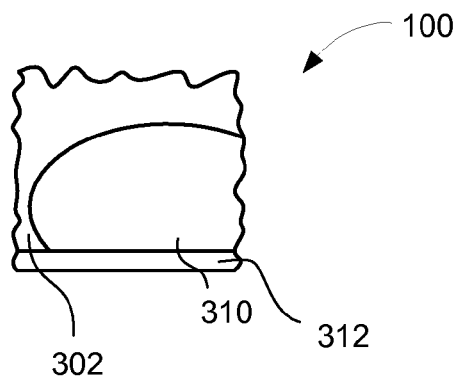
FIG. 3F is the integrated circuit packaging system of FIG. 3B after an implant barrier growth phase of manufacture.

Referring now to FIG. 3F, therein is shown the integrated circuit packaging system 100 of FIG. 3B after an implant barrier growth phase of manufacture. The integrated circuit packaging system 100 is shown having an implant barrier 312 such as silicon-nitride deposited covering the wafer 302 and the deep subcollector well 310.

Figure 3G:
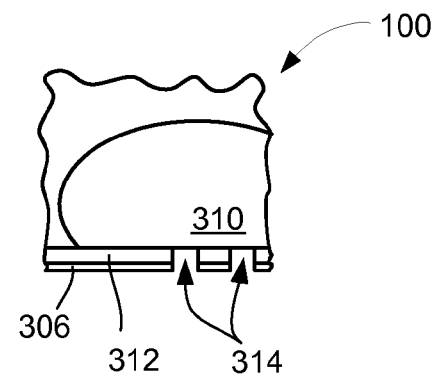
FIG. 3G is the integrated circuit packaging system of FIG. 3B after an implant barrier etch phase of manufacture.

Referring now to FIG. 3G, therein is shown the integrated circuit packaging system 100 of FIG. 3B after an implant barrier etch phase of manufacture.

The integrated circuit packaging system 100 is shown having the photo resist 306 deposited on an implant barrier 312. The implant barrier 312 has been etched to reveal portions 314 of the deep subcollector wells 310 that will become transistor wells.

Figure 3H:
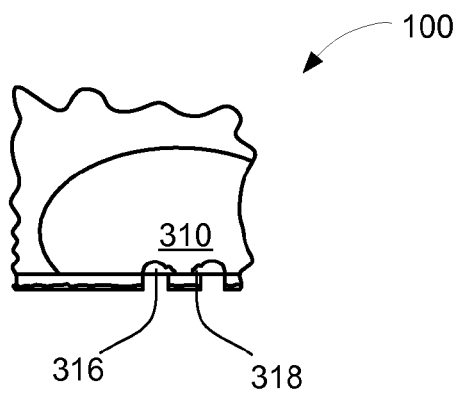
FIG. 3H is the integrated circuit packaging system of FIG. 3B after an implant phase of manufacture.

Referring now to FIG. 3H, therein is shown the integrated circuit packaging system 100 of FIG. 3B after an implant phase of manufacture. The integrated circuit packaging system 100 is shown having transistor wells 316 implanted into the deep subcollector wells 310. The transistor wells 316 are shown having extensions 318. The extensions are low doping regions of source and drain toward channel and prevents premature breakdown of drain-substrate junction.

Figure 3I:
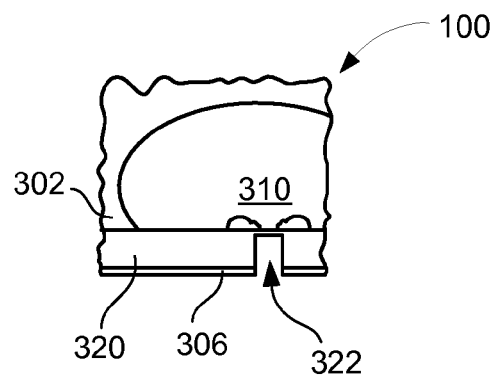
FIG. 3I is the integrated circuit packaging system of FIG. 3B after a gate dielectric etch phase of manufacture.

Referring now to FIG. 3I, therein is shown the integrated circuit packaging system 100 of FIG. 3B after a gate dielectric etch phase of manufacture. The integrated circuit packaging system 100 is shown having the implant barrier 312 of FIG. 3G removed. A gate dielectric 320 such as silicon dioxide (SiO2) is deposited covering the deep subcollector wells 310, the wafer 302. The photo resist 306 has been deposited on the gate dielectric 320. The gate dielectric 320 is etched to form a gate trench 322.

Figure 3J:
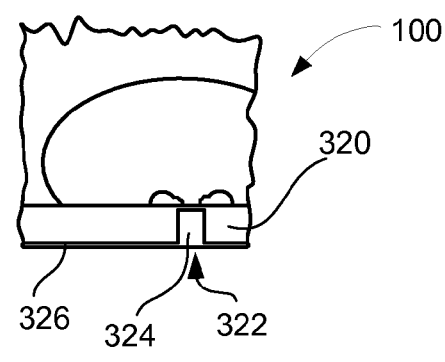
FIG. 3J is the integrated circuit packaging system of FIG. 3B after a gate deposition phase of manufacture.

Referring now to FIG. 3J, therein is shown the integrated circuit packaging system 100 of FIG. 3B after a gate deposition phase of manufacture. The integrated circuit packaging system 100 is shown having the photo resist 306 of FIG. 3I stripped and a gate 324 deposited in the gate trench 322. The gate 324 may be formed by metal deposition and may consist of stacked Ti-nitride (TiN), Ti-Aluminum (TiAl), Tantalum (Ta), and Ti-nitride (TiN). A gate metal layer 326 is also shown covering the gate dielectric 320.

Figure 3K:
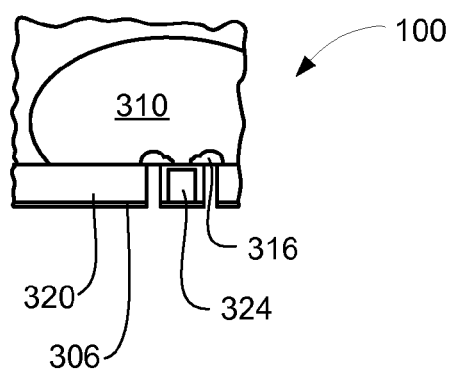
FIG. 3K is the integrated circuit packaging system of FIG. 3B after a source and drain trench forming phase of manufacture.

Referring now to FIG. 3K, therein is shown the integrated circuit packaging system 100 of FIG. 3B after a source and drain trench forming phase of manufacture. The integrated circuit packaging system 100 is shown having the gate metal layer 326 of FIG. 3J etched back to expose the gate dielectric 320. The photo resist 306 is deposited covering the gate dielectric 320 and the gate 324. The gate dielectric 320 is etched below the transistor wells 316 to expose the deep subcollector wells 310 from the gate dielectric 320.

Figure 3L:
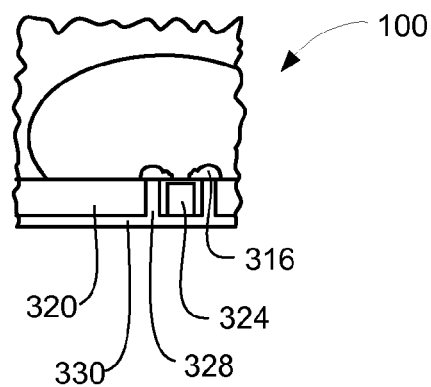
FIG. 3L is the integrated circuit packaging system of FIG. 3B after a source and drain deposition phase of manufacture.

Referring now to FIG. 3L, therein is shown the integrated circuit packaging system 100 of FIG. 3B after a source and drain deposition phase of manufacture. The integrated circuit packaging system 100 is shown having source and drain plugs 328 such as Tungsten (W) source and drain plugs deposited on the transistor wells 316 exposed from the gate dielectric 320. A source and drain residual layer 330 covers the gate 324, and the gate dielectric 320.

Figure 4:
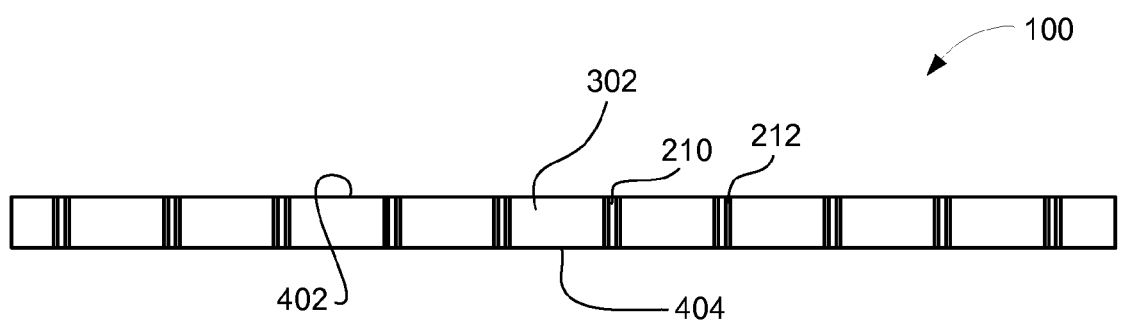
FIG. 4 is the integrated circuit packaging system of FIG. 2 after a metal filling phase of manufacture.

Referring now to FIG. 4, therein is shown the integrated circuit packaging system 100 of FIG. 2 after a metal filling phase of manufacture. The integrated circuit packaging system 100 is shown having the through-conductors 210 in the inside the vias 204. The through-conductor 210 spans the height of the vias 204 from the top side 402 of the wafer 302 to the bottom side 404 of the wafer 302. Between the wafer 302 and the through-conductors 210 is the insulator 212.

Figure 5:
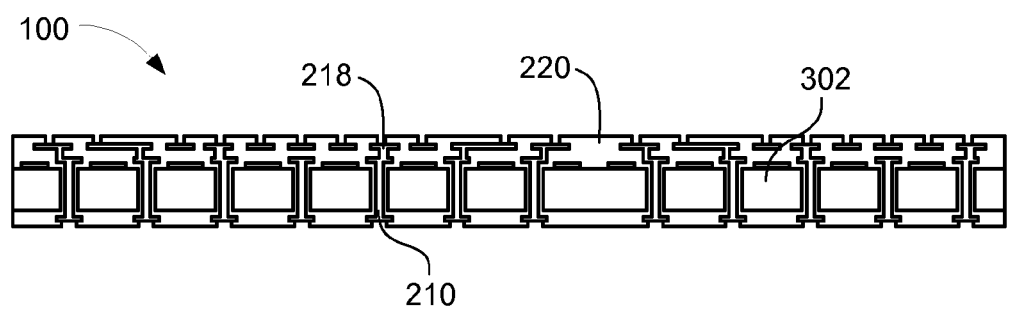
FIG. 5 is the integrated circuit packaging system of FIG. 2 after a back-end metallization buildup phase of manufacture.

Referring now to FIG. 5, therein is shown the integrated circuit packaging system 100 of FIG. 2 after a back-end metallization buildup phase of manufacture. The integrated circuit packaging system 100 is shown having the RDL 218 surrounded by the insulator 220.

The RDL 218 may be copper (Cu) or Aluminum (Al) with a Ti-nitride (TiN) barrier metal to prevent the migration. The through-conductors 210 may be planarized before the RDL 218 is deposited.

Figure 6:
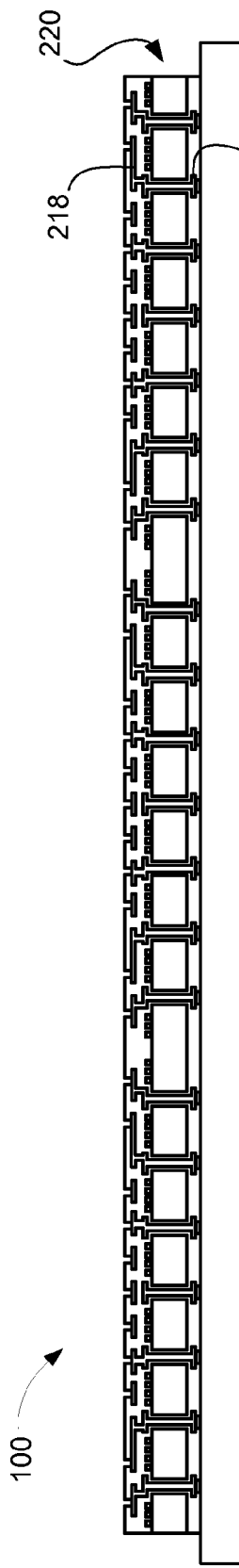
FIG. 6 is the integrated circuit packaging system of FIG. 2 after an insulation etch phase of manufacture.

Referring now to FIG. 6, therein is shown the integrated circuit packaging system 100 of FIG. 2 after an insulation etch phase of manufacture. The integrated circuit packaging system 100 is shown having portions of the contact pads 216 and the RDL 218 exposed from the insulator 220.

Figure 7:
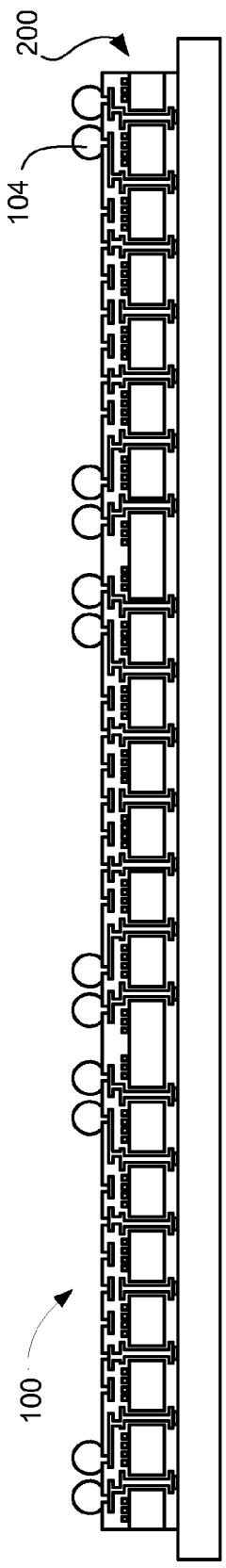
FIG. 7 is the integrated circuit packaging system of FIG. 2 after a solder ball interconnect mounting phase of manufacture.

Referring now to FIG. 7, therein is shown the integrated circuit packaging system 100 of FIG. 2 after a solder ball interconnect mounting phase of manufacture. The integrated circuit packaging system 100 is shown having the interconnects 104 deposited above the TSV base 200.

Figure 8:
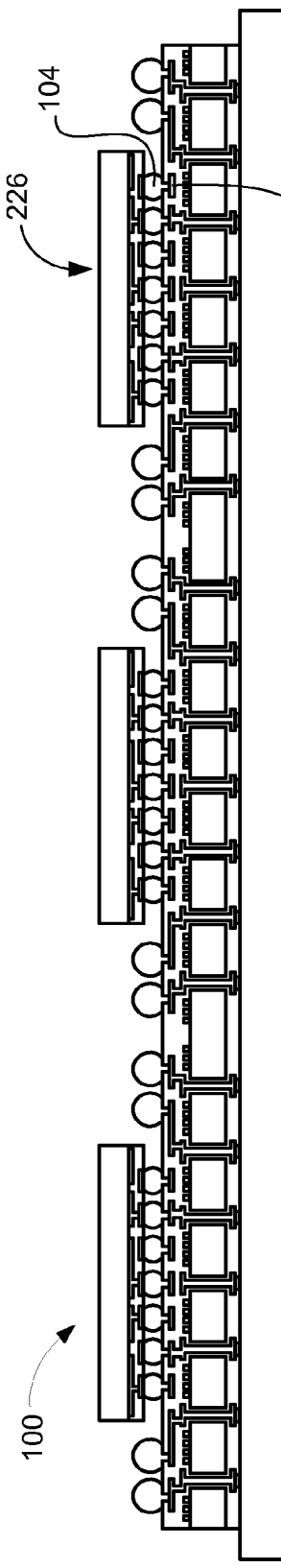
FIG. 8 is the integrated circuit packaging system of FIG. 2 after an integrated circuit bonding phase of manufacture.

Referring now to FIG. 8, therein is shown the integrated circuit packaging system 100 of FIG. 2 after an integrated circuit bonding phase of manufacture. The integrated circuit packaging system 100 is shown having the integrated circuit 226 mounted above the TSV base 200 and connected to the RDL 218 with the interconnects 104.

Figure 9:
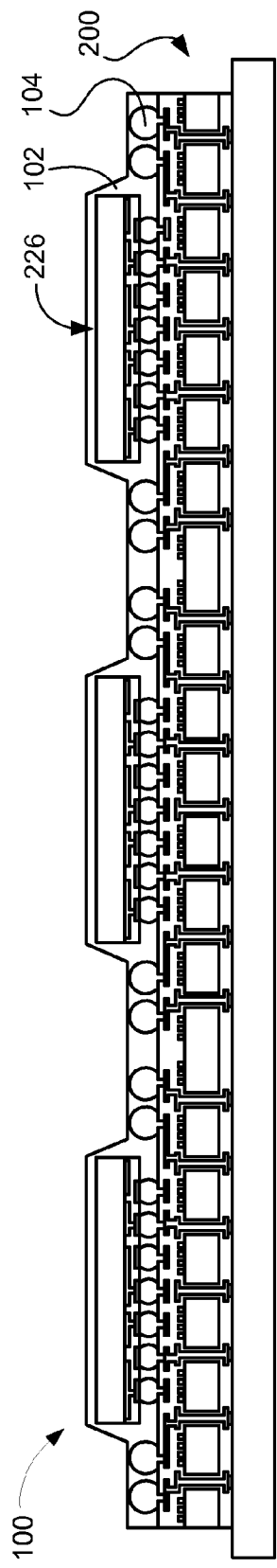
FIG. 9 is the integrated circuit packaging system of FIG. 2 after a wafer level encapsulation phase of manufacture.

Referring now to FIG. 9, therein is shown the integrated circuit packaging system 100 of FIG. 2 after a wafer level encapsulation phase of manufacture. The integrated circuit packaging system 100 is shown having the encapsulation 102 encapsulating the interconnects 104 surrounding the integrated circuit 226 and encapsulating the integrated circuit 226 above the TSV base 200.

Figure 10:
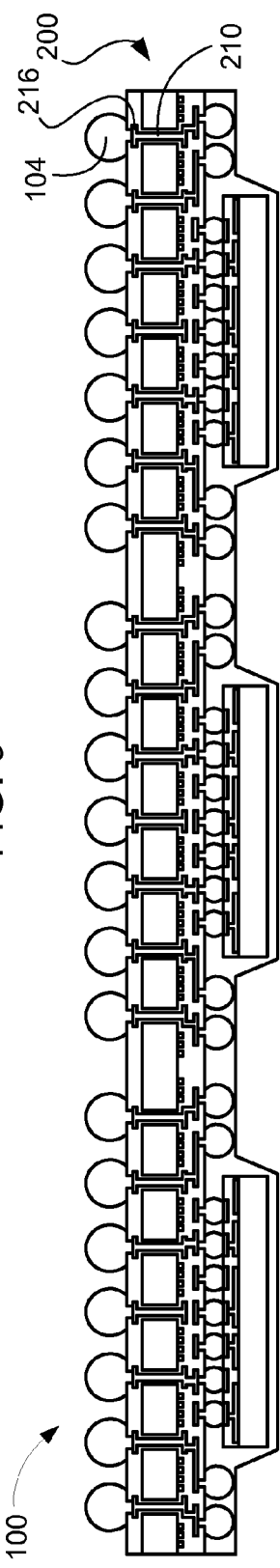
FIG. 10 is the integrated circuit packaging system of FIG. 2 after a bottom solder ball mounting phase of manufacture.
Figure 11:
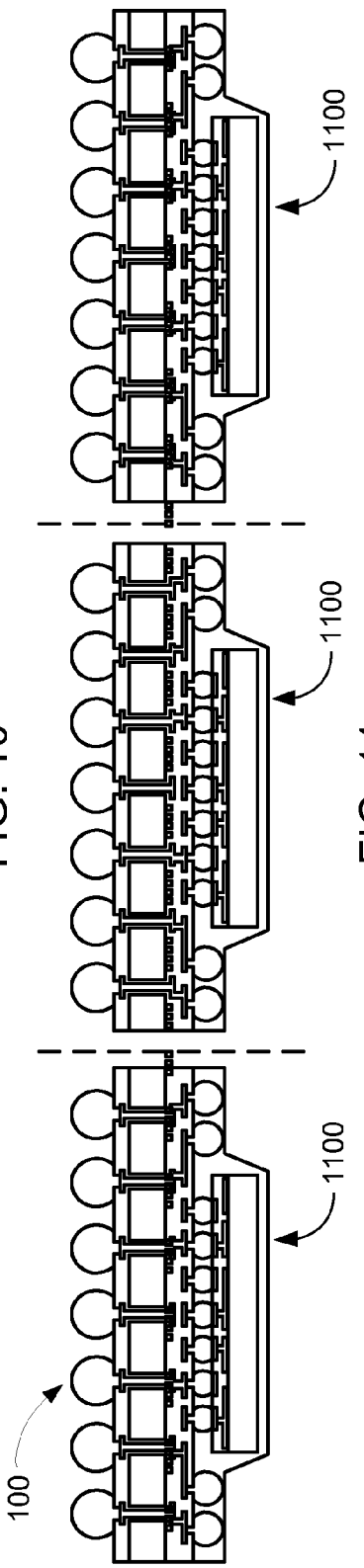
FIG. 11 is the integrated circuit packaging system of FIG. 2 after a singulation phase of manufacture.

Referring now to FIG. 10, therein is shown the integrated circuit packaging system 100 of FIG. 2 after a bottom solder ball mounting phase of manufacture. The integrated circuit packaging system 100 is shown having the interconnects 104 deposited to the TSV base 200 connected to portions of the contact pads 216 of the through-conductors 210.

Referring now to FIG. 1, therein is shown the integrated circuit packaging system 100 of FIG. 2 after a singulation phase of manufacture. The integrated circuit packaging system 100 is shown having individual integrated circuit packaging systems 1100 individually singulated.

Figure 12:
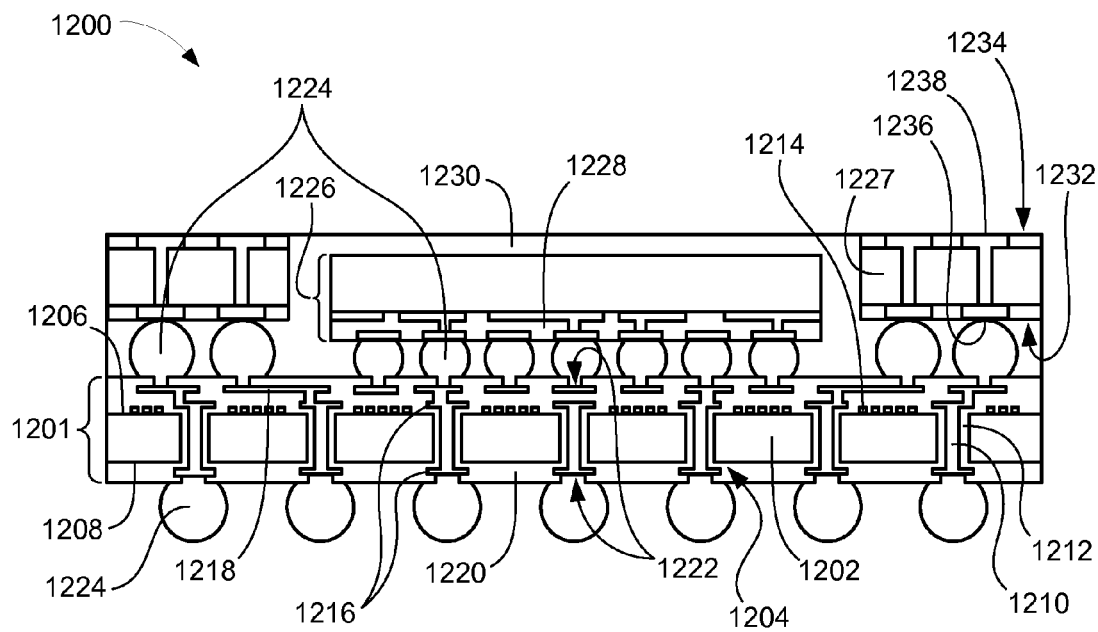
FIG. 12 is a cross-sectional view of an integrated circuit packaging system in a second embodiment of the present invention.

Referring now to FIG. 12, therein is shown a cross-sectional view of an integrated circuit packaging system 1200 in a second embodiment of the present invention. The integrated circuit packaging system 1200 is shown having a through-silicon-via base (TSV base 1201). The TSV base 1201 is shown having a substrate 1202 such as a through-silicon-via substrate having vias 1204 etched through the substrate 1202 from a top side 1206 through a bottom side 1208. The substrate 1202 has through-conductors 1210 such as metal through-conductors inside the vias 1204. The through-conductor 1210 is defined as a conductive element that spans the height of the vias 1204 from the top side 1206 of the substrate 1202 to the bottom side 1208 of the substrate 1202.

Between the substrate 1202 and the through-conductors 1210 is an insulator 1212 such as silicone dioxide. The top side 1206 of the substrate 1202 may be bare silicone or may be functional containing active components such as transistors 1214 such as CMOS transistors.

The through-conductors 1210 have contact pads 1216 on both ends of the through-conductors 1210. Above the transistors 1214 and connected to the contact pads 1216 is a redistribution line (RDL 1218). The RDL 1218 routs signals from the through-conductors 1210 to other components and other connective nodes above the top side 1206 of the substrate 1202.

Surrounding the contact pads 1216, the RDL 1218, the transistors 1214, and the top side 1206 and the bottom side 1208 of the substrate 1202 is an insulator 1220 such as silicon dioxide. The insulator 1220 has holes 1222 etched out to expose portions of the contact pads 1216 of the through-conductors 1210 and portions of the RDL 1218.

Interconnects 1224 such as solder bumps are deposited underneath the TSV base 1201 and in the holes 1222 of the insulator 1220. A chip such as an integrated circuit 1226 such as a flip-chip is attached to the TSV base 1201 and connected to the RDL 1218 with the interconnects 1224. The integrated circuit 1226 has an active side 1228 facing the substrate 1202.

The interconnects 1224 are also deposited above the TSV base 1201 in the holes 1222 of the insulator 1220 and bordering the integrated circuit 1226. Mounted above the interconnects 1224 that border the integrated circuit 1226 is an interposer 1227 such as a UV stabilized woven glass and epoxy resin with etched copper conductive pathways.

The interposer 1227 surrounds the integrated circuit 1226. The interconnects 1224 bordering the integrated circuit 1226, the interposer 1227, and the integrated circuit 1226 are encapsulated by an encapsulation 1230 such as a film assisted molding, which protects sensitive components from moisture, dust and other contamination.

The interposer 1227 and the integrated circuit 1226 are exposed from the encapsulation 1230. The interposer 1227 is shown having two functional sides, such as a first functional side 1232 and a second functional side 1234, which allow for electrical signals to be routed between exposed conductors, such as exposed conductor 1236, exposed from the first functional side 1232, and exposed conductor 1238, exposed from the second functional side 1234 for later connection to external components.

Figure 13:
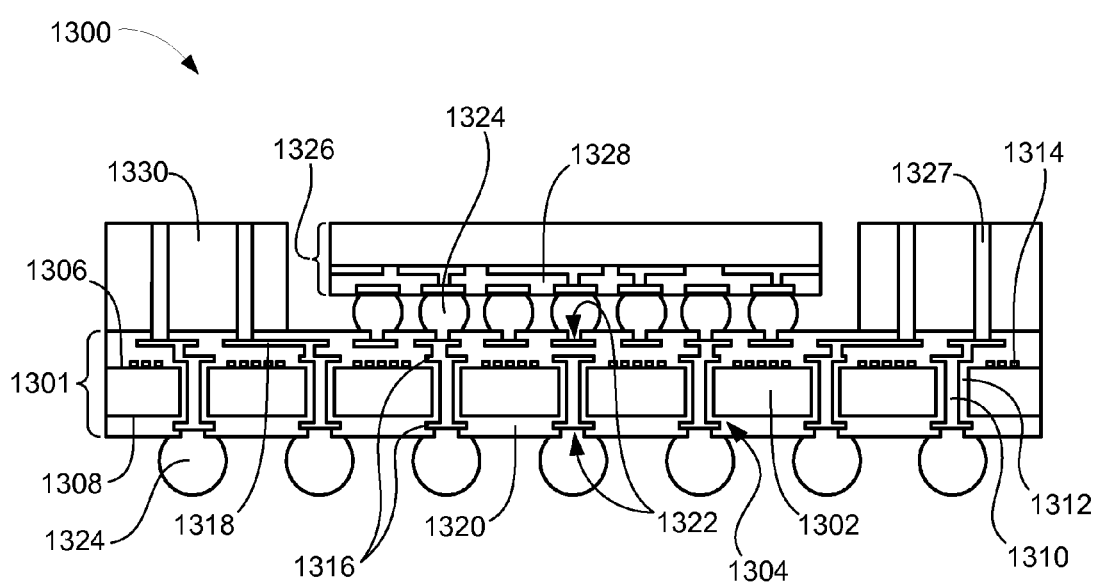
FIG. 13 is a cross-sectional view of an integrated circuit packaging system in a third embodiment of the present invention.

Referring now to FIG. 13, therein is shown a cross-sectional view of an integrated circuit packaging system 1300 in a third embodiment of the present invention. The integrated circuit packaging system 1300 is shown having a through-silicon-via base (TSV base 1301). The TSV base 1301 is shown having a substrate 1302 such as a through-silicon-via substrate having vias 1304 etched through the substrate 1302 from a top side 1306 through a bottom side 1308. The substrate 1302 has through-conductors 1310 such as metal through-conductors inside the vias 1304. The through-conductor 1310 is defined as a conductive element that spans the height of the vias 1304 from the top side 1306 of the substrate 1302 to the bottom side 1308 of the substrate 1302.

Between the substrate 1302 and the through-conductors 1310 is an insulator 1312 such as silicone dioxide. The top side 1306 of the substrate 1302 may be bare silicone or may be functional containing active components such as transistors 1314 such as CMOS transistors.

The through-conductors 1310 have contact pads 1316 on both ends of the through-conductors 1310. Above the transistors 1314 and connected to the contact pads 1316 is a redistribution line (RDL 1318). The RDL 1318 routs signals from the through-conductors 1310 to other components and other connective nodes above the top side 1306 of the substrate 1302.

Surrounding the contact pads 1316, the RDL 1318, the transistors 1314, and the top side 1306 and the bottom side 1308 of the substrate 1302 is an insulator 1320 such as silicon dioxide. The insulator 1320 has holes 1322 etched out to expose portions of the contact pads 1316 of the through-conductors 1310 and portions of the RDL 1318.

Interconnects 1324 such as solder bumps are deposited underneath the TSV base 1301 and in the holes 1322 of the insulator 1320. A chip such as an integrated circuit 1326 such as a flip-chip is attached to the TSV base 1301 and connected to the RDL 1318 with the interconnects 1324. The integrated circuit 1326 has an active side 1328 facing the substrate 1302.

Interconnects such as metal posts 1327 are also deposited above the TSV base 1301 in the holes 1322 of the insulator 1320 and bordering the integrated circuit 1326. The metal posts 1327 are encapsulated by an encapsulation 1330 such as a film assisted molding above the TSV base 1301. The encapsulation 1330 surrounds the integrated circuit 1326 but does not encapsulate the integrated circuit 1326 leaving the integrated circuit 1326 exposed.

Figure 14:
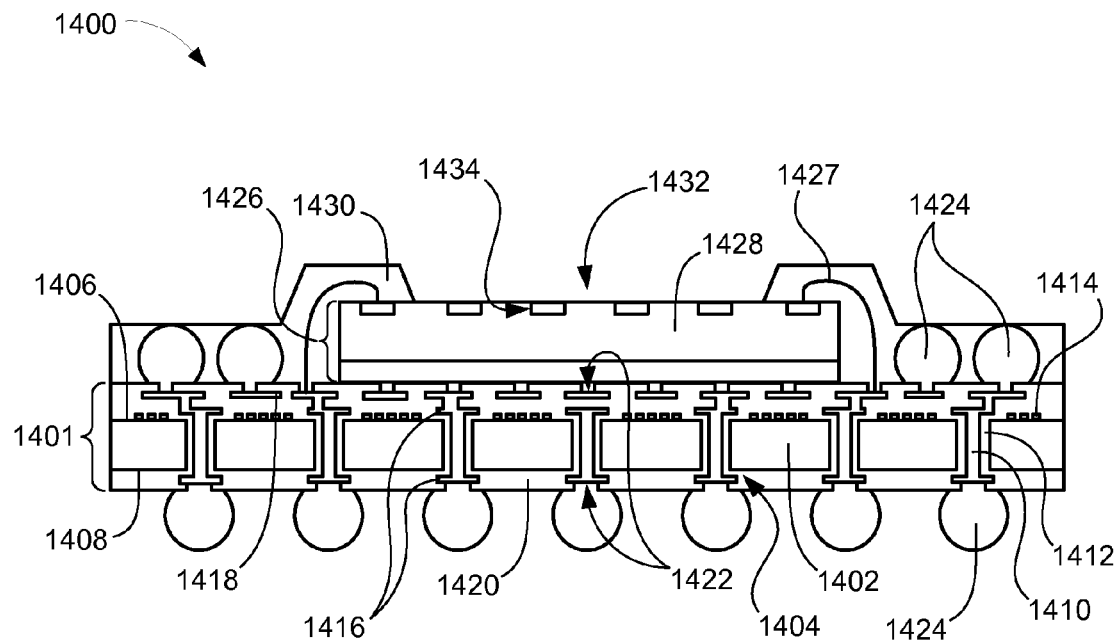
FIG. 14 is a cross-sectional view of an integrated circuit packaging system in a fourth embodiment of the present invention.

Referring now to FIG. 14, therein is shown a cross-sectional view of an integrated circuit packaging system 1400 in a fourth embodiment of the present invention. The integrated circuit packaging system 1400 is shown having a through-silicon-via base (TSV base 1401). The TSV base 1401 is shown having a substrate 1402 such as a through-silicon-via substrate having vias 1404 etched through the substrate 1402 from a top side 1406 through a bottom side 1408. The substrate 1402 has through-conductors 1410 such as metal through-conductors inside the vias 1404. The through-conductor 1410 is defined as a conductive element that spans the height of the vias 1404 from the top side 1406 of the substrate 1402 to the bottom side 1408 of the substrate 1402.

Between the substrate 1402 and the through-conductors 1410 is an insulator 1412 such as silicone dioxide. The top side 1406 of the substrate 1402 may be bare silicone or may be functional containing components 1414 such as passive components, such as resistors, capacitors, or inductors.

The through-conductors 1410 have contact pads 1416 on both ends of the through-conductors 1410. Above the components 1414 and connected to the contact pads 1416 is a redistribution line (RDL 1418). The RDL 1418 routs signals from the through-conductors 1410 to other components and other connective nodes above the top side 1406 of the substrate 1402.

Surrounding the contact pads 1416, the RDL 1418, the components 1414, and the top side 1406 and the bottom side 1408 of the substrate 1402 is an insulator 1420 such as silicon dioxide. The insulator 1420 has holes 1422 etched out to expose portions of the contact pads 1416 of the through-conductors 1410 and portions of the RDL 1418.

Interconnects 1424 such as solder bumps are deposited underneath the TSV base 1401 and in the holes 1422 of the insulator 1420. A chip such as an integrated circuit 1426 such as a wire-bonded die is attached to the TSV base 1401 and connected to the RDL 1418 with interconnects such as bond wires 1427. The integrated circuit 1426 has an active side 1428 facing away from the substrate 1402.

The interconnects 1424 are also deposited above the TSV base 1401 in the holes 1422 of the insulator 1420 and bordering the integrated circuit 1426. The interconnects 1424 bordering the integrated circuit 1426, the integrated circuit 1426, and the bond wires 1427 are encapsulated by an encapsulation 1430 such as a film assisted molding, which protects sensitive components from moisture, dust and other contamination.

The interconnects 1424 bordering the integrated circuit 1426 are exposed from the encapsulation 1430 as is a portion 1432 of the active side 1428 on the integrated circuit 1426. The bond wires 1427 are fully encapsulated by the encapsulation 1430 for structural reinforcement.

On the portion 1432 of the integrated circuit 1426 exposed from the encapsulation 1430, a redistribution line such as an integrated circuit redistribution line 1434 is formed to rout signals between points on the active side 1428 of the integrated circuit 1426 and connection points of an external component.

Figure 15:
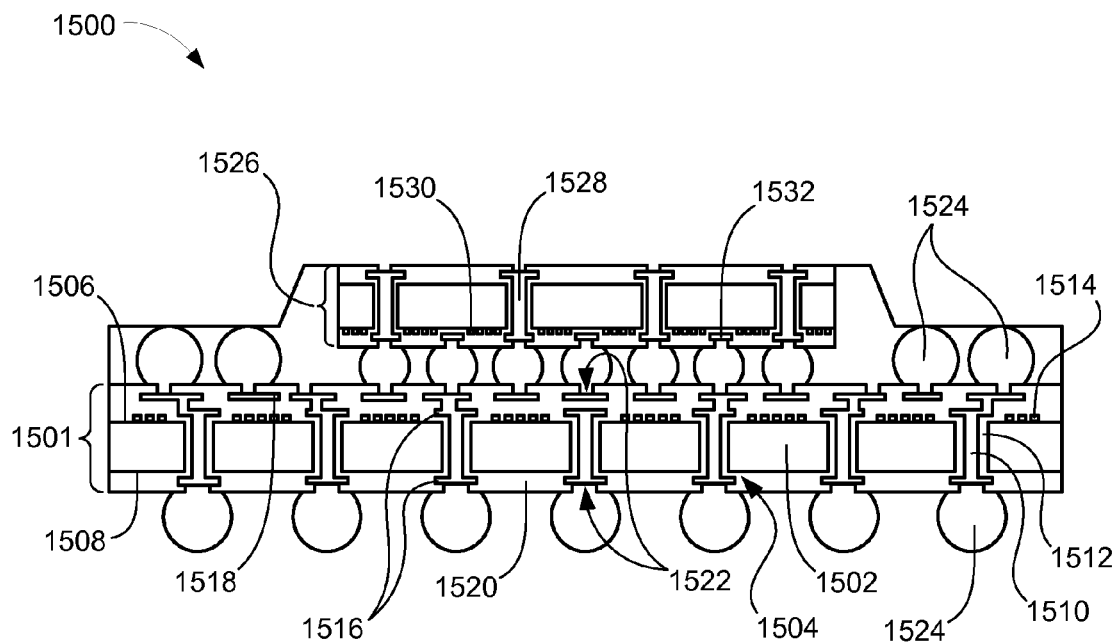
FIG. 15 is a cross-sectional view of an integrated circuit packaging system in a fifth embodiment of the present invention.

Referring now to FIG. 15, therein is shown a cross-sectional view of an integrated circuit packaging system 1500 in a fifth embodiment of the present invention. The integrated circuit packaging system 1500 is shown having a through-silicon-via base (TSV base 1501). The TSV base 1501 is shown having a substrate 1502 such as a through-silicon-via substrate having vias 1504 etched through the substrate 1502 from a top side 1506 through a bottom side 1508. The substrate 1502 has through-conductors 1510 such as metal through-conductors inside the vias 1504. The through-conductor 1510 is defined as a conductive element that spans the height of the vias 1504 from the top side 1506 of the substrate 1502 to the bottom side 1508 of the substrate 1502.

Between the substrate 1502 and the through-conductors 1510 is an insulator 1512 such as silicone dioxide. The top side 1506 of the substrate 1502 may be bare silicone or may be functional containing active components such as transistors 1514 such as CMOS transistors.

The through-conductors 1510 have contact pads 1516 on both ends of the through-conductors 1510. Above the transistors 1514 and connected to the contact pads 1516 is a redistribution line (RDL 1518). The RDL 1518 routs signals from the through-conductors 1510 to other components and other connective nodes above the top side 1506 of the substrate 1502.

Surrounding the contact pads 1516, the RDL 1518, the transistors 1514, and the top side 1506 and the bottom side 1508 of the substrate 1502 is an insulator 1520 such as silicon dioxide. The insulator 1520 has holes 1522 etched out to expose portions of the contact pads 1516 of the through-conductors 1510 and portions of the RDL 1518.

Interconnects 1524 such as solder bumps are deposited underneath the TSV base 1501 and in the holes 1522 of the insulator 1520. A chip such as a second through-silicon-via die (second TSV die 1526) constructed largely similar to the TSV base 1501, is attached to the TSV base 1501 and connected to the RDL 1518 with interconnects 1524. The second TSV die 1526 is shown having second TSV through-conductors 1528, second TSV transistors 1530, a second TSV redistribution line 1532, and a second TSV insulator 1534. The second TSV transistors 1530 and the second TSV redistribution line 1532 face the TSV base 1501.

The interconnects 1524 are also deposited above the TSV base 1501 in the holes 1522 of the insulator 1520 on the TSV base 1501 and bordering the second TSV die 1526. The interconnects 1524 bordering the second TSV die 1526 and the second TSV die 1526 are encapsulated by an encapsulation 1530 such as a film assisted molding, which protects sensitive components from moisture, dust and other contamination.

The interconnects 1524 bordering the second TSV die 1526 are exposed from the encapsulation 1530 as are the second TSV through-conductors 1528 for later connection to external components.

Figure 16:
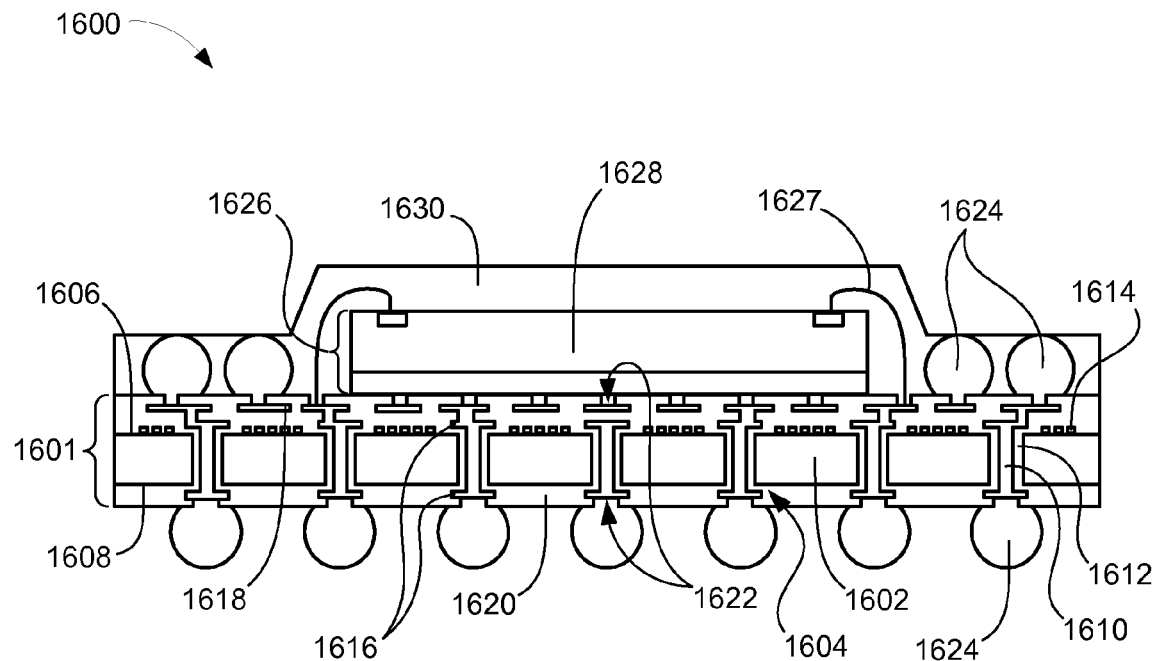
FIG. 16 is a cross-sectional view of an integrated circuit packaging system in a sixth embodiment of the present invention.

Referring now to FIG. 16, therein is shown a cross-sectional view of an integrated circuit packaging system 1600 in a sixth embodiment of the present invention. The integrated circuit packaging system 1600 is shown having a through-silicon-via base (TSV base 1601). The TSV base 1601 is shown having a substrate 1602 such as a through-silicon-via substrate having vias 1604 etched through the substrate 1602 from a top side 1606 through a bottom side 1608. The substrate 1602 has through-conductors 1610 such as metal through-conductors inside the vias 1604. The through-conductor 1610 is defined as a conductive element that spans the height of the vias 1604 from the top side 1606 of the substrate 1602 to the bottom side 1608 of the substrate 1602.

Between the substrate 1602 and the through-conductors 1610 is an insulator 1612 such as silicone dioxide. The top side 1606 of the substrate 1602 may be bare silicone or may be functional containing active components such as transistors 1614 such as CMOS transistors.

The through-conductors 1610 have contact pads 1616 on both ends of the through-conductors 1610. Above the transistors 1614 and connected to the contact pads 1616 is a redistribution line (RDL 1618). The RDL 1618 routs signals from the through-conductors 1610 to other components and other connective nodes above the top side 1606 of the substrate 1602.

Surrounding the contact pads 1616, the RDL 1618, the transistors 1614, and the top side 1606 and the bottom side 1608 of the substrate 1602 is an insulator 1620 such as silicon dioxide. The insulator 1620 has holes 1622 etched out to expose portions of the contact pads 1616 of the through-conductors 1610 and portions of the RDL 1618.

Interconnects 1624 such as solder bumps are deposited underneath the TSV base 1601 and in the holes 1622 of the insulator 1620. A chip such as an integrated circuit 1626 such as a wire-bonded die is attached to the TSV base 1601 and connected to the RDL 1618 with interconnects 1627 such as bond wires. The integrated circuit 1626 has an active side 1628 facing away from the substrate 1602.

The interconnects 1624 are also deposited above the TSV base 1601 in the holes 1622 of the insulator 1620 and bordering the integrated circuit 1626. The interconnects 1624 bordering the integrated circuit 1626 and the integrated circuit 1626 are encapsulated by an encapsulation 1630 such as a film assisted molding, which protects sensitive components from moisture, dust and other contamination.

The interconnects 1624 bordering the integrated circuit 1626 are exposed from the encapsulation 1630 for later connection to external components.

Figure 17A:
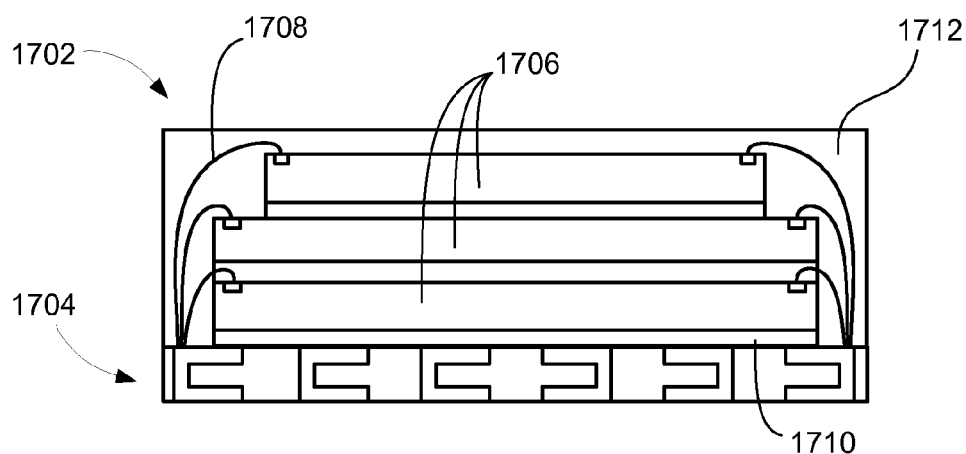
FIGS. 17A-E are cross-sectional views of external electric components for an embodiment of the present invention.

Referring now to FIG. 17A, therein is shown a cross-sectional view of an external electric component such as an array package 1702 having a substrate 1704 with multiple-integrated-circuit-dies 1706 stacked above the substrate 1704. The multiple-integrated-circuit-dies 1706 are connected to the substrate 1704 with interconnects such as bond wires 1708. The multiple-integrated-circuit-dies 1706 are attached with a die attach adhesive 1710. An encapsulation 1712 such as a film assisted molding encapsulates the multiple-integrated-circuit-dies 1706 and the bond wires 1708.

Figure 17B:
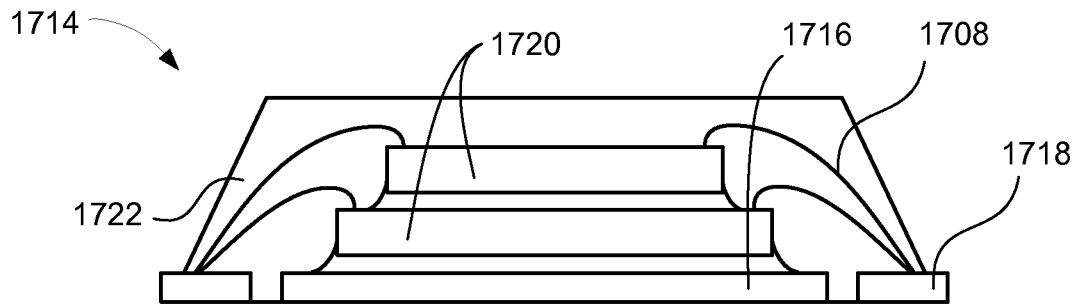

Referring now to FIG. 17B, therein is shown a cross-sectional view of an external electric component such as a quad-flatpak package 1714 having a die pad 1716 and bond-fingers 1718. Stacked above the die pad 1716 are multiple-integrated-circuit-dies 1720 attached with the die attach adhesive 1710. The multiple-integrated-circuit-dies 1720 are connected to the bond fingers 1718 with the bond wires 1708. The multiple-integrated-circuit-dies 1720 and the bond wires 1708 are encapsulated in an encapsulation 1722 such as a film assisted molding.

Figure 17C:
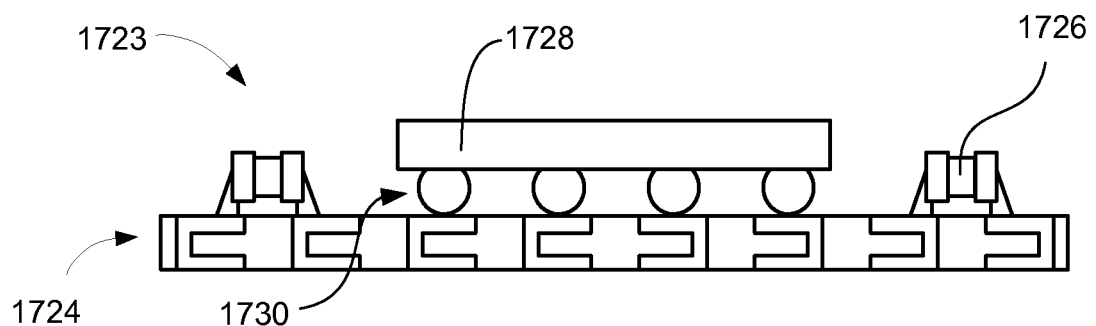

Referring now to FIG. 17C, therein is shown a cross-sectional view of an external electric component such as a compound circuit 1723 having a substrate 1724. Above the substrate 1724 passive components 1726 such as resistors, capacitors, and inductors are mounted peripheral to an integrated circuit 1728 such as a flip chip. The integrated circuit 1728 is connected to the substrate 1724 with interconnects such as solder bumps 1730.

Figure 17D:
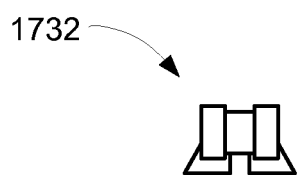

Referring now to FIG. 17D, therein is shown a cross-sectional view of an external electric component such as a passive component 1732 such as a resistor, capacitor, or inductor.

Figure 17E:
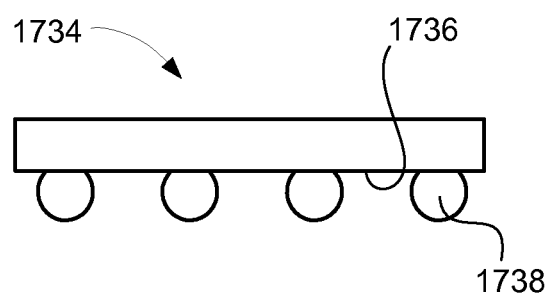

Referring now to FIG. 17E, therein is shown a cross-sectional view of an external electric component such as an integrated circuit die 1734 such as a flip chip. The integrated circuit die 1734 is shown having an active side 1736 with interconnects 1738 such as solder bumps mounted below.

Figure 18:
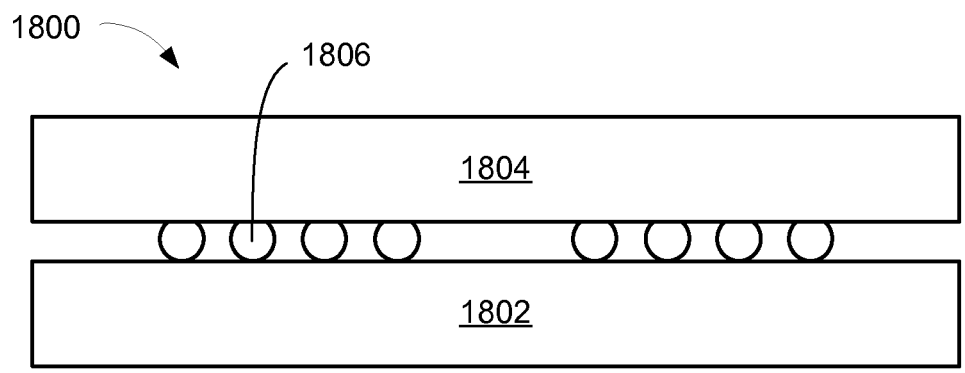
FIG. 18 is a diagram of a seventh embodiment of the present invention.

Referring now to FIG. 18, therein is shown a diagram of a seventh embodiment of the present invention. The diagram 1800 is shown having any one of the integrated circuit packaging systems from FIGS. 2, or 12-16 in a block 1802 with any one of the external electric components from FIGS. 17A-E in a block 1804 and mounted above the block 1802. The block 1804 is shown connected to the block 1802 with external interconnects such as solder bumps 1806.

Figure 19:
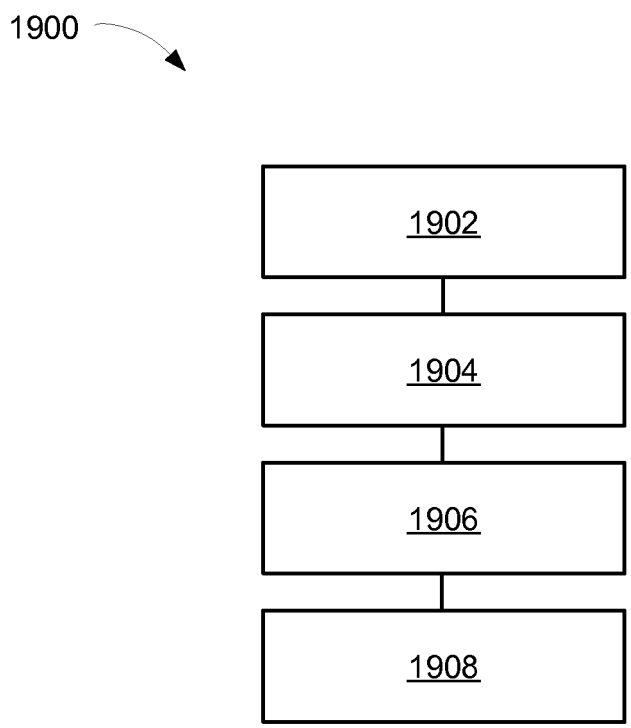
FIG. 19 is a flow chart of a method of manufacture of an integrated circuit packaging system of FIG. 1 in a further embodiment of the present invention.

Referring now to FIG. 19, therein is shown a flow chart of a method 1000 of manufacture of an integrated circuit packaging system 100 of FIG. 1 in a further embodiment of the present invention. The method 1000 includes providing a base having a through-conductor spanning the height of the base, and having an insulator protecting the base and the through-conductor in a block 1002; mounting a chip over the base and connected to the base with a first interconnect in a block 1004; forming a second interconnect above the base and horizontally beside the chip in a block 1006; and encapsulating the chip, the first interconnect, and the second interconnect with an encapsulation in a block 1008.

It has been discovered that the present invention thus has numerous aspects.

A principle aspect that has been discovered is that the present invention provides strong warpage resistance due to the silicon based substrate.

Another aspect is the use of the through-silicon-via base allows an active surface to be fabricated directly on the substrate, and further allows a for a chip to be mounted thereover having a second active surface, thus reducing overall package height and greatly increasing package density.

Another aspect is that the use of the through-silicon-via base reduces the manufacturing cycle time by reducing the number of process steps.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the fan in interposer on lead system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a through silicon via base having a substrate with a via through the substrate, a through-conductor filling the via from a top side of the substrate to a bottom side of the substrate, and a redistribution line over the through-conductor;
   forming an insulator conformed to the redistribution line and the top side and the bottom side of the substrate;
   mounting a chip over the through silicon via base and connected to the through silicon via base with a first interconnect;
   forming a second interconnect above the through silicon via base and horizontally beside the chip; and
   encapsulating the chip, the first interconnect, and the second interconnect with an encapsulation.

2. The method as claimed in claim 1 further comprising:
   forming a passive component in the through silicon via base.

3. The method as claimed in claim 1 further comprising forming a hole in the insulator to expose the redistribution line.

4. The method as claimed in claim 1 wherein:
   encapsulating the second interconnect includes leaving a portion of the second interconnect exposed from the encapsulation.

5. The method as claimed in claim 1 wherein:
   mounting the chip includes mounting a flip-chip, a wire-bonded die, or a through-silicon-via die.

6. A method of manufacture of an integrated circuit packaging system comprising:
   providing a substrate;
   etching a via through the substrate;
   filling the via with a through-conductor;
   forming contact pads on the through-conductor above and below the substrate;
   forming a redistribution line over the contact pads;
   forming an insulator conformed to the redistribution line and the top side and the bottom side of the substrate;
   mounting a chip over the substrate and connected to the substrate with a first interconnect;
   forming a second interconnect above the substrate and horizontally beside the chip; and
   encapsulating the chip, the first interconnect, and the second interconnect with an encapsulation.

7. The method as claimed in claim 6 wherein:
   forming the insulator includes depositing a second insulator; and further comprising:
   depositing a first insulator in the via, the first insulator directly on the through-conductor and the portion of the substrate within the via.

8. The method as claimed in claim 6 further comprising:
   forming a contact pad wider than the through-conductor on an end of the through-conductor; and
   forming a hole in the insulator exposing the contact pad.

9. The method as claimed in claim 6 wherein:
   forming the second interconnect includes depositing a solder ball, a metal post, or a solder ball and an interposer.

10. The method as claimed in claim 6 further comprising:
    mounting an array package, a quad-flatpak package, a compound circuit, a passive component, an integrated circuit die, or a combination thereof, above the chip and connected to the chip to the second interconnect or a combination thereof with an external interconnect.

11. An integrated circuit packaging system comprising:
    a through silicon via base having a substrate with a via through the substrate, a through-conductor filled in the via from a top side of the substrate to a bottom side of the substrate, and a redistribution line over the through-conductor;
    an insulator conformed to the redistribution line and the top side and the bottom side of the substrate;
    a chip mounted over the through silicon via base;
    a first interconnect connecting the chip to the through silicon via base;
    a second interconnect formed above the through silicon via base and horizontally beside the chip; and
    an encapsulation encapsulating the first interconnect and the second interconnect.

12. The system as claimed in claim 11 further comprising:
    a passive component formed in the through silicon via base.

13. The system as claimed in claim 11 further comprising a hole in the insulator to expose the redistribution line.

14. The system as claimed in claim 11 wherein:
    the second interconnect has a portion exposed from the encapsulation.

15. The system as claimed in claim 11 wherein:
    the chip is a flip-chip, a wire-bonded die, or a through-silicon-via die.

16. The system as claimed in claim 11 further comprising contact pads on the through-conductor above and below the substrate.

17. The system as claimed in claim 16 wherein the insulator includes a first insulator and a second insulator with the first insulator in the via and directly on the through conductor and the portion of the substrate within the via.

18. The system as claimed in claim 16 further comprising:
    a contact pad wider than the through-conductor on an end of the through-conductor; and
    wherein:
    the insulator has a hole exposing the contact pad.

19. The system as claimed in claim 16 wherein:
    the second interconnect is a solder ball, a metal post, or a solder ball and an interposer.

20. The system as claimed in claim 16 further comprising:
    an external interconnect; and
    an array package, a quad-flatpak package, a compound circuit, a passive component, an integrated circuit die, or a combination thereof, mounted above the chip and connected to the chip to the second interconnect or a combination thereof with the external interconnect.

* * * * *

UNITED STATES PATENT AND TRADEMARK OFFICE
CERTIFICATE OF CORRECTION

PATENT NO. : 8,587,129 B2
APPLICATION NO. : 12/534029
DATED : November 19, 2013
INVENTOR(S) : Chi et al.

Page 1 of 1

It is certified that error appears in the above-identified patent and that said Letters Patent is hereby corrected as shown below:

In the Specification:

Column 4, line 51, delete "silicone dioxide" and insert therefor --silicon dioxide--

Column 4, line 52, delete "bare silicone" and insert therefor --bare silicon--

Column 8, line 2, delete "silicone dioxide" and insert therefor --silicon dioxide--

Column 8, line 3, delete "bare silicone" and insert therefor --bare silicon--

Column 8, line 60, delete "silicone dioxide" and insert therefor --silicon dioxide--

Column 8, line 61, delete "bare silicone" and insert therefor --bare silicon--

Column 9, line 39, delete "silicone dioxide" and insert therefor --silicon dioxide--

Column 9, line 40, delete "bare silicone" and insert therefor --bare silicon--

Column 10, line 29, delete "silicone dioxide" and insert therefor --silicon dioxide--

Column 10, line 30, delete "bare silicone" and insert therefor --bare silicon--

Column 11, line 19, delete "silicone dioxide" and insert therefor --silicon dioxide--

Column 11, line 20, delete "bare silicone" and insert therefor --bare silicon--

Signed and Sealed this
Tenth Day of November, 2015

Michelle K. Lee
*Director of the United States Patent and Trademark Office*